United States Patent
Chen et al.

(10) Patent No.: US 10,357,105 B2
(45) Date of Patent: Jul. 23, 2019

(54) COUPLING ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 3 days.

(21) Appl. No.: 15/891,688

(22) Filed: Feb. 8, 2018

(65) Prior Publication Data
US 2018/0360212 A1 Dec. 20, 2018

(30) Foreign Application Priority Data
Jun. 20, 2017 (TW) .............................. 106120806 A

(51) Int. Cl.
*A47B 88/423* (2017.01)
*H05K 7/14* (2006.01)
*A47B 88/427* (2017.01)

(52) U.S. Cl.
CPC .......... *A47B 88/423* (2017.01); *H05K 7/1489* (2013.01); *A47B 2088/4272* (2017.01)

(58) Field of Classification Search
CPC .......... A47B 88/423; A47B 2088/4272; H05K 7/1489
See application file for complete search history.

(56) References Cited

U.S. PATENT DOCUMENTS

| 9,629,460 | B1 | 4/2017 | Chen et al. | |
|---|---|---|---|---|
| 10,172,458 | B2* | 1/2019 | Chen | A47B 88/43 |
| 2015/0069196 | A1* | 3/2015 | Chen | A47B 47/0058 248/218.4 |
| 2015/0201754 | A1* | 7/2015 | Chen | A47B 96/025 248/219.3 |
| 2017/0079427 | A1* | 3/2017 | Chen | H05K 7/1489 |
| 2017/0224110 | A1* | 8/2017 | Chen | A47B 88/43 |
| 2017/0354055 | A1* | 12/2017 | Hsu | H05K 7/1489 |
| 2018/0014640 | A1* | 1/2018 | Chen | A47B 57/34 |

(Continued)

FOREIGN PATENT DOCUMENTS

CN 102695396 B 12/2014

*Primary Examiner* — Hanh V Tran
(74) *Attorney, Agent, or Firm* — Rosenberg, Klein & Lee

(57) ABSTRACT

A bracket device includes a bracket, a fastening member, a supporting frame, and a fitting. The fastening member is movable with respect to the bracket. Once the supporting frame is operated and thus displaced with respect to the bracket to a first position, the fastening member is supported by the supporting frame and hence in a particular position. Once the supporting frame is operated and thus displaced with respect to the bracket to a second position, the fastening member is not supported by the supporting frame and therefore no longer in the particular position. When the fitting is at a predetermined position, the supporting frame is prevented from displacement from the first position to the second position.

13 Claims, 10 Drawing Sheets

(56) References Cited

U.S. PATENT DOCUMENTS

| | | | |
|---|---|---|---|
| 2018/0098626 A1* | 4/2018 | Chen | A47B 88/43 |
| 2018/0116398 A1* | 5/2018 | Chen | A47B 88/43 |
| 2018/0125234 A1* | 5/2018 | Chen | H05K 7/1489 |
| 2018/0199713 A1* | 7/2018 | Chen | A47B 88/43 |
| 2018/0360215 A1* | 12/2018 | Chen | H05K 7/1489 |

* cited by examiner

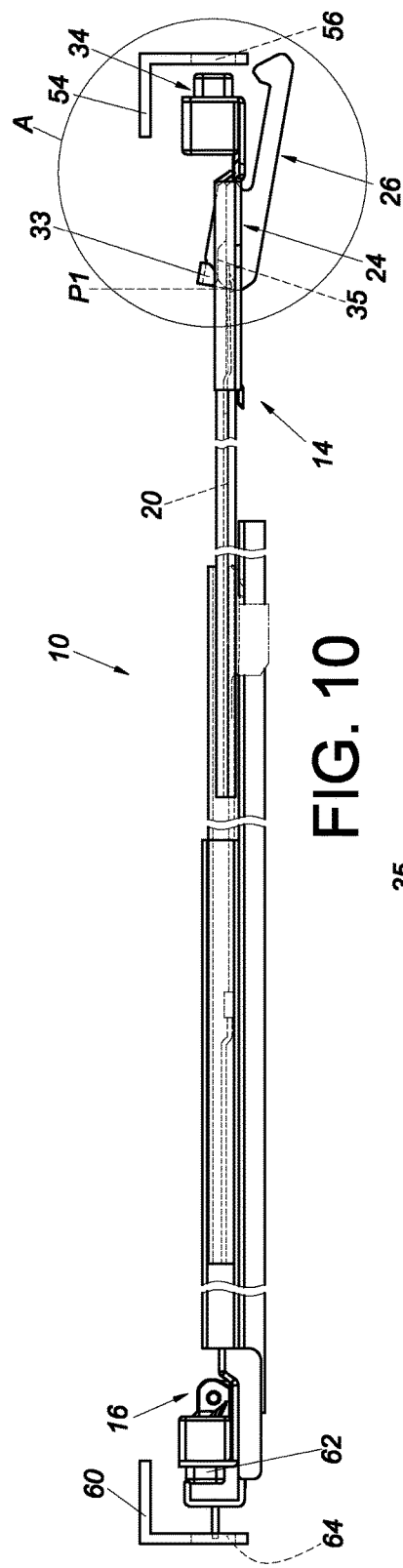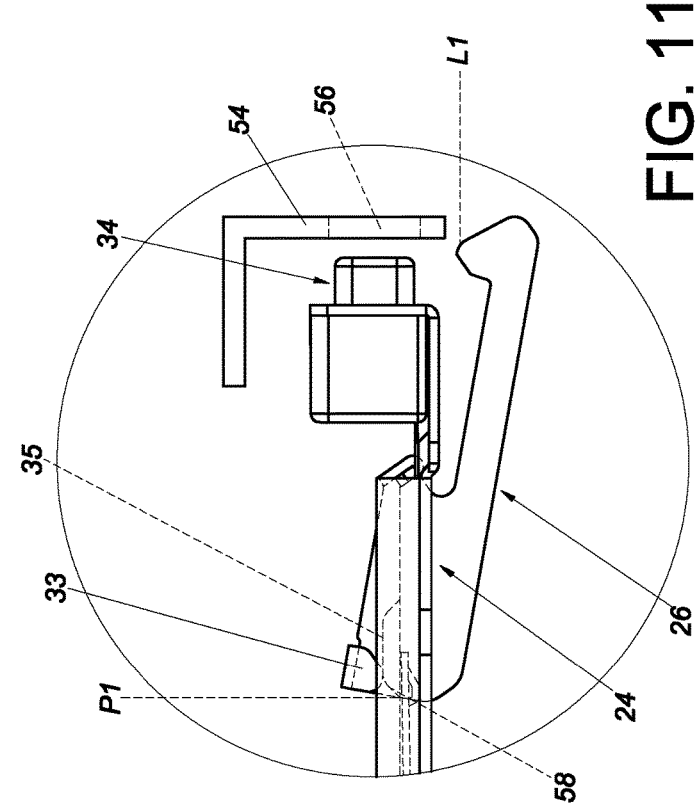

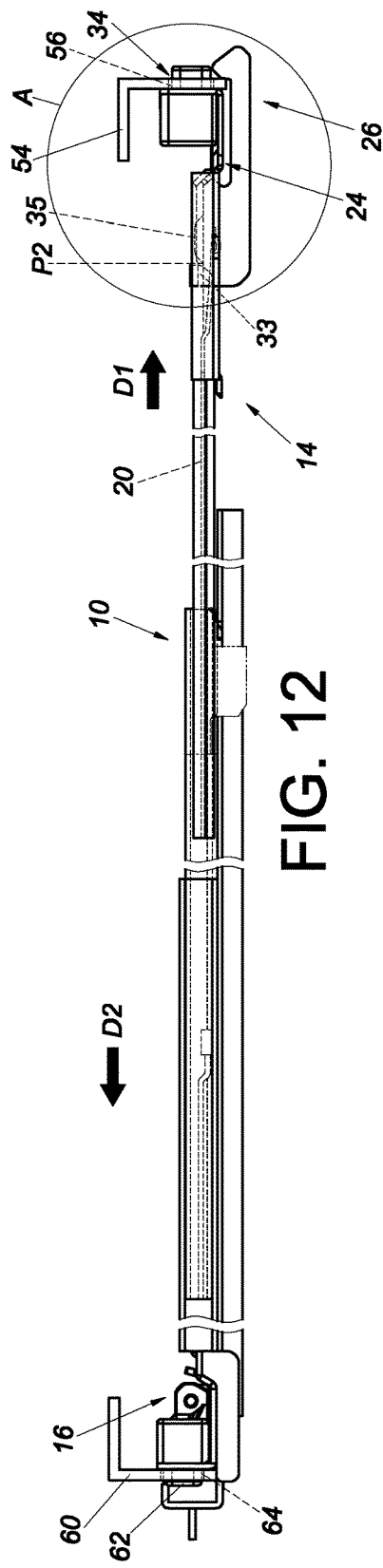
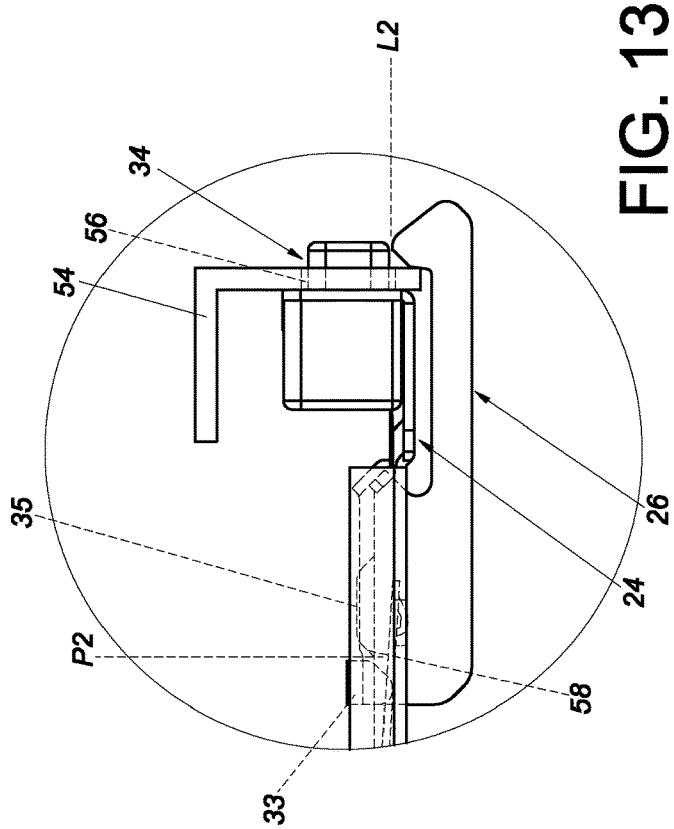
FIG. 12
FIG. 13

COUPLING ASSEMBLY AND BRACKET DEVICE THEREOF

FIELD OF THE INVENTION

The present invention relates to a coupling assembly and more particularly to one with a fitting for preventing the fastening member of a bracket device from leaving a particular position.

BACKGROUND OF THE INVENTION

Chinese Patent No. 102695396B discloses a slide rail tool-free mounting frame for a server. The slide rail tool-free mounting frame includes a pair of rack positioning posts (4) provided on a slide rail rear mounting frame (1) and a rack floating hook (2). The rack floating hook (2) includes a pair of hooks (203) respectively provided on a pair of wings (205). The pair of wings (205) are each provided with a slide guide sleeve (201) and are in fixed connection through an "arch"-shaped bent element (206). The slide rail rear mounting frame (1) is fixedly provided with two slide guide posts (101) which are respectively sleeved in the slide guide sleeves (201) and are in fixed connection through limit screws (7). A first return spring (6) is mounted around each slide guide sleeve (201) and between the corresponding wing (205) and limit screw (7). The slide rail rear mounting frame (1) is further provided with a floating pin hole (104) in which a floating pin (3) is placed. One end of the floating pin (3) is connected to the "arch"-shaped bent element (206) through a limit screw (7) while the other end of the floating pin (3) is a conical head (301) provided in the floating pin hole (104). A second return spring (5) is mounted around the floating pin (3) and between an end face of the conical head (301) and the corresponding limit screw (7).

According to the above arrangement, the floating pin (3) can be driven by an outer rail member of a slide rail to lock/release the slide rail rear mounting frame (1), wherein the outer rail member is housed in the rear mounting frame. The slide rail tool-free mounting frame, however, lacks a mechanism for preventing arbitrary displacement of the hooks (203).

SUMMARY OF THE INVENTION

One objective of the present invention is to provide a bracket device that has a mechanism for preventing a fastening member from leaving a particular position.

According to one aspect of the present invention, a bracket device includes a bracket, a fastening member, and a fitting. The fastening member can be displaced to either an unlocked position or a locked position by operation. When the fitting is at a predetermined position, the fastening member cannot be displaced from the unlocked position to the locked position, but when the fitting is not at the predetermined position, the fastening member can be displaced from the unlocked position to the locked position to fasten the bracket to a post.

Preferably, the bracket of the bracket device is provided with a mounting member in order to be mounted to the post.

Preferably, the bracket device further includes a supporting frame that can be displaced with respect to the bracket. When the fitting is not at the predetermined position, the supporting frame can be displaced with respect to the bracket from a first position to a second position, thereby displacing the fastening member from the unlocked position to the locked position.

Preferably, one of the bracket and the supporting frame includes a guiding feature that makes it easier to displace the supporting frame with respect to the bracket.

Preferably, the fastening member is movably mounted on the bracket and includes a first supporting portion, and the supporting frame includes a second supporting portion. When the supporting frame is at the first position, the second supporting portion of the supporting frame supports the first supporting portion of the fastening member such that the fastening member is at the unlocked position. When the supporting frame is at the second position, the second supporting portion of the supporting frame does not support the first supporting portion of the fastening member such that the fastening member is no longer at the unlocked position.

Preferably, the predetermined position is defined by one of the supporting frame and the bracket, and the bracket device further includes a blocking feature on the other one of the supporting frame and the bracket. When the fitting is at the predetermined position, the blocking feature and the fitting work together to prevent the supporting frame from being displaced with respect to the bracket from the first position to the second position.

According to another aspect of the invention, a bracket device includes a bracket, a fastening member, a supporting frame, and a fitting. The fastening member is movably mounted on the bracket and has a first supporting portion. The supporting frame has a second supporting portion. Once the supporting frame is operated and thereby displaced with respect to the bracket to a first position, the second supporting portion of the supporting frame supports the first supporting portion of the fastening member such that the fastening member is in a particular position. Once the supporting frame is operated and thereby displaced with respect to the bracket to a second position, the second supporting portion of the supporting frame does not support the first supporting portion of the fastening member such that the fastening member is no longer in that particular position. Moreover, when the fitting is at a predetermined position on the supporting frame, the supporting frame cannot be displaced with respect to the bracket from the first position to the second position, but when the fitting is not at the predetermined position, the supporting frame can be displaced with respect to the bracket from the first position to the second position.

According to yet another aspect of the invention, a coupling assembly is adapted for mounting to a post and includes a slide rail mechanism and a bracket device. The bracket device is coupled to the slide rail mechanism and includes a bracket, a fastening member, and a fitting. The bracket is provided with a mounting member in order to be mounted to the post. The fastening member can be displaced to either an unlocked position or a locked position by operation. When the fitting is at a predetermined position, the fastening member cannot be displaced from the unlocked position to the locked position, but when the fitting is not at the predetermined position, the fastening member can be displaced from the unlocked position to the locked position to fasten the bracket to the post.

BRIEF DESCRIPTION OF THE DRAWINGS

FIG. 10 shows that the coupling assembly in accordance with an embodiment of the present invention is applied to a rack;

FIG. 11 is an enlarged view of the circled area A in FIG. 10;

FIG. 12 shows that the coupling assembly in accordance with an embodiment of the present invention is mounted on the rack;

FIG. 13 is an enlarged view of the circled area A in FIG. 12; and

DETAILED DESCRIPTION OF THE INVENTION

Figure 1:
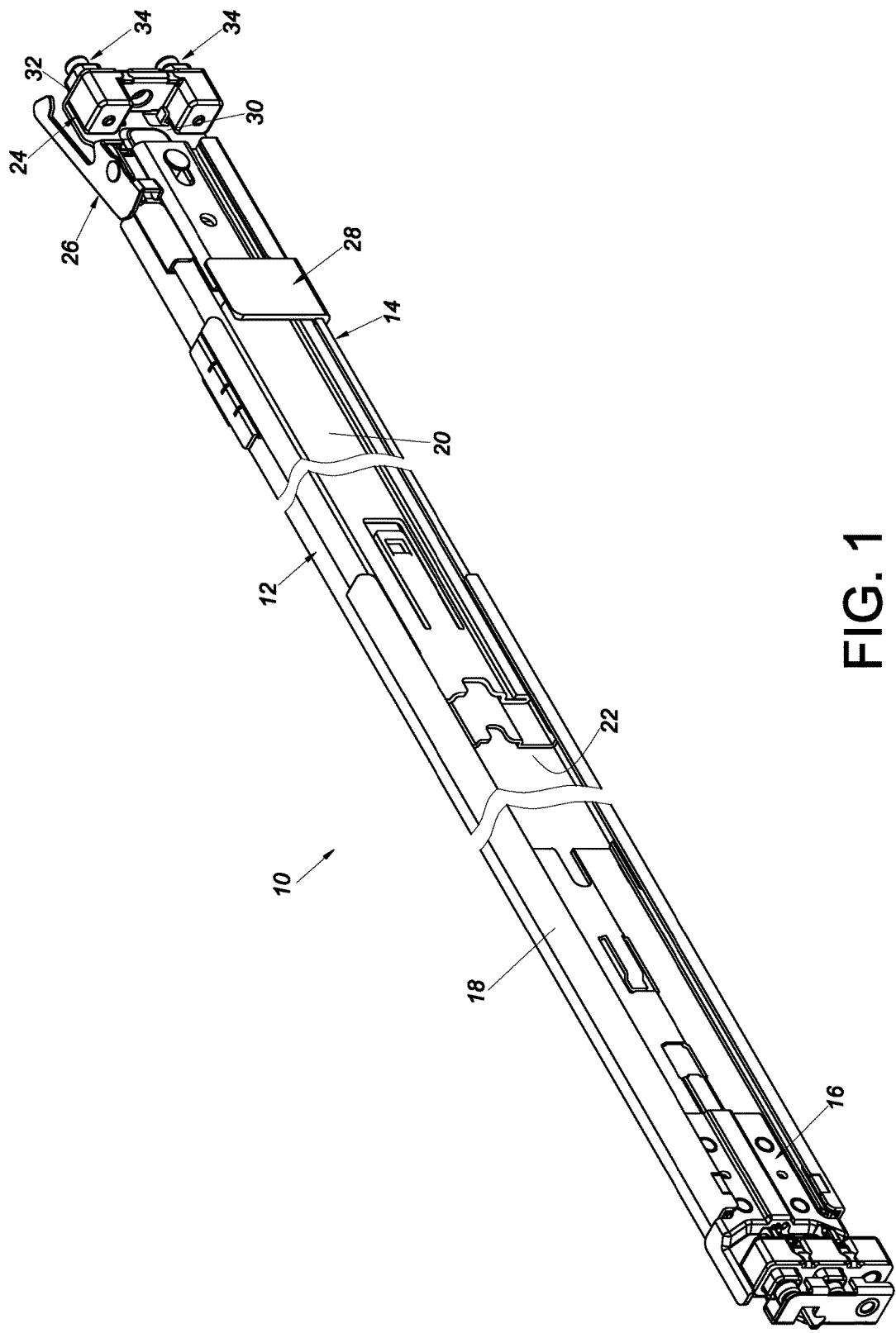
FIG. 1 is a perspective view of the coupling assembly in accordance with an embodiment of the present invention.

Referring to FIG. 1, a coupling assembly 10 in an embodiment of the present invention includes a slide rail mechanism 12, a bracket device 14, and preferably another bracket device 16, wherein the bracket devices 14 and 16 are coupled to the slide rail mechanism 12. Preferably, the bracket devices 14 and 16 are located respectively adjacent to a rear portion and a front portion of the slide rail mechanism 12 by means of a supporting rail section 18 on one side of the slide rail mechanism 12. Here, by way of example, the bracket device 16 is fixedly coupled to the supporting rail section 18, and the bracket device 14 is mounted in a supporting channel 22 of the supporting rail section 18 via at least one supporting frame 20 and is movable with respect to the supporting rail section 18. The present invention has no limitation on how the bracket devices 14 and 16 are mounted. The bracket device 14 includes a bracket 24, a fastening member 26, and a fitting 28. The bracket 24 includes a sidewall 30, an end wall 32 substantially perpendicularly coupled to the sidewall 30, and at least one mounting member 34 provided on the end wall 32.

Figure 2:
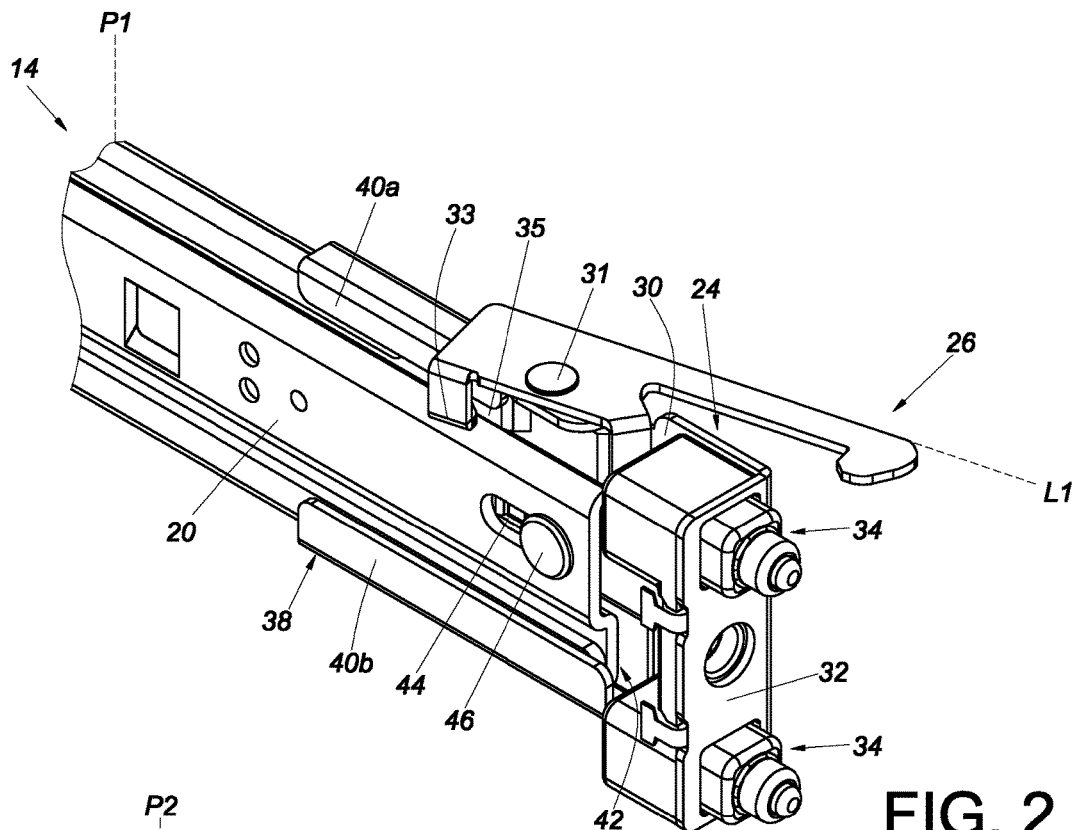
FIG. 2 shows the bracket device in accordance with an embodiment of the present invention, wherein the fastening member of the bracket device is at an unlocked position.

As shown in FIG. 2, the fastening member 26 is movably mounted on the bracket 24. Here, by way of example, the fastening member 26 is pivotally connected with respect to the bracket 24 via a pin 31. The fastening member 26 includes a first supporting portion 33 while the supporting frame 20 includes a second supporting portion 35. The supporting frame 20 can be displaced with respect to the bracket 24. Once the supporting frame 20 is operated and thus displaced with respect to the bracket 24 to a first position P1, the second supporting portion 35 of the supporting frame 20 supports the first supporting portion 33 of the fastening member 26 such that the fastening member 26 is at an unlocked position L1 (also referred to in the claims as a particular position) with respect to the end wall 32 of the bracket 24.

Figure 3:
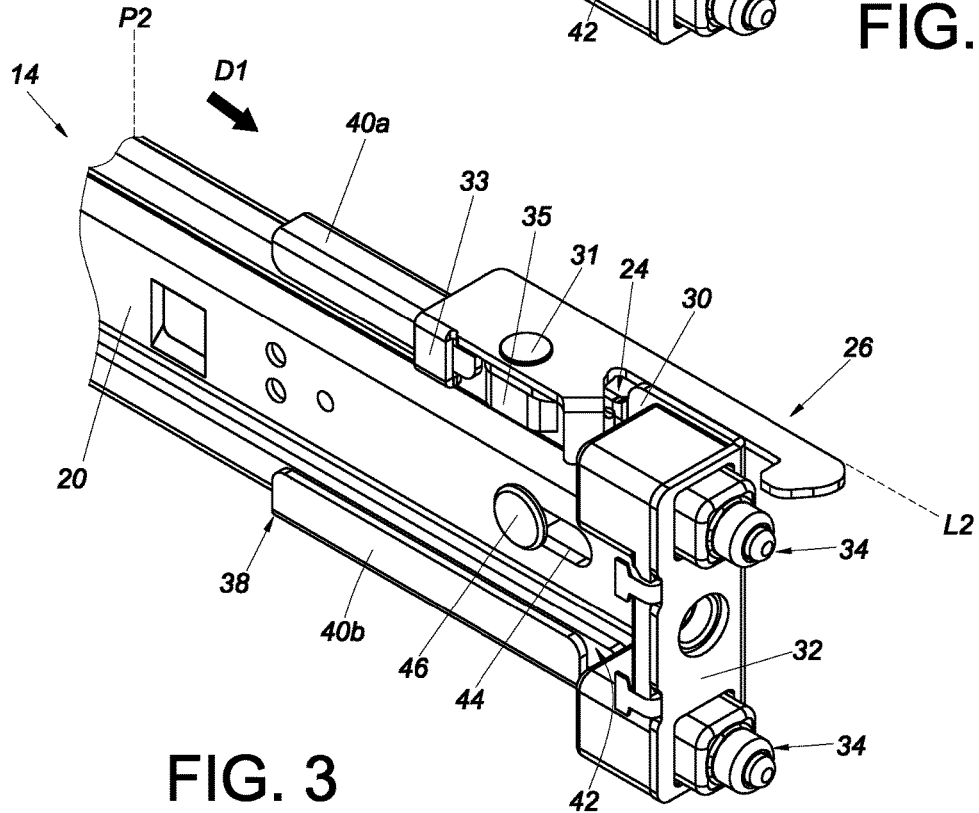
FIG. 3 shows the bracket device in accordance with an embodiment of the present invention, wherein the fastening member of the bracket device is at a locked position.

Referring to FIG. 3 in conjunction with FIG. 2, once the supporting frame 20 is further operated and thus displaced in a first direction D1 with respect to the bracket 24 from the first position P1 to a second position P2, the second supporting portion 35 of the supporting frame 20 ceases to support the first supporting portion 33 of the fastening member 26. As a result, the fastening member 26 is no longer at the unlocked position L1 with respect to the end wall 32 of the bracket 24. For example, the fastening member 26 is pivoted from the unlocked position L1 to a locked position L2.

Preferably, one of the bracket 24 and the supporting frame 20 includes a guiding feature 38 so that the supporting frame 20 can be easily displaced with respect to the bracket 24. Here, by way of example, the sidewall 30 of the bracket 24 has an upper portion 40a and a lower portion 40b that define a guiding channel 42, and the supporting frame 20 can be displaced through the guiding channel 42 with respect to the bracket 24. Preferably, the bracket device 14 further includes a position-limiting structure 44 through which the supporting frame 20 and the bracket 24 can displace with respect to each other to a limited extent. Here, the position-limiting structure 44 is a slot with a boundary, and a coupling member 46 extends through a portion of the position-limiting structure 44 to couple the supporting frame 20 to the sidewall 30 of the bracket 24.

Figure 4:
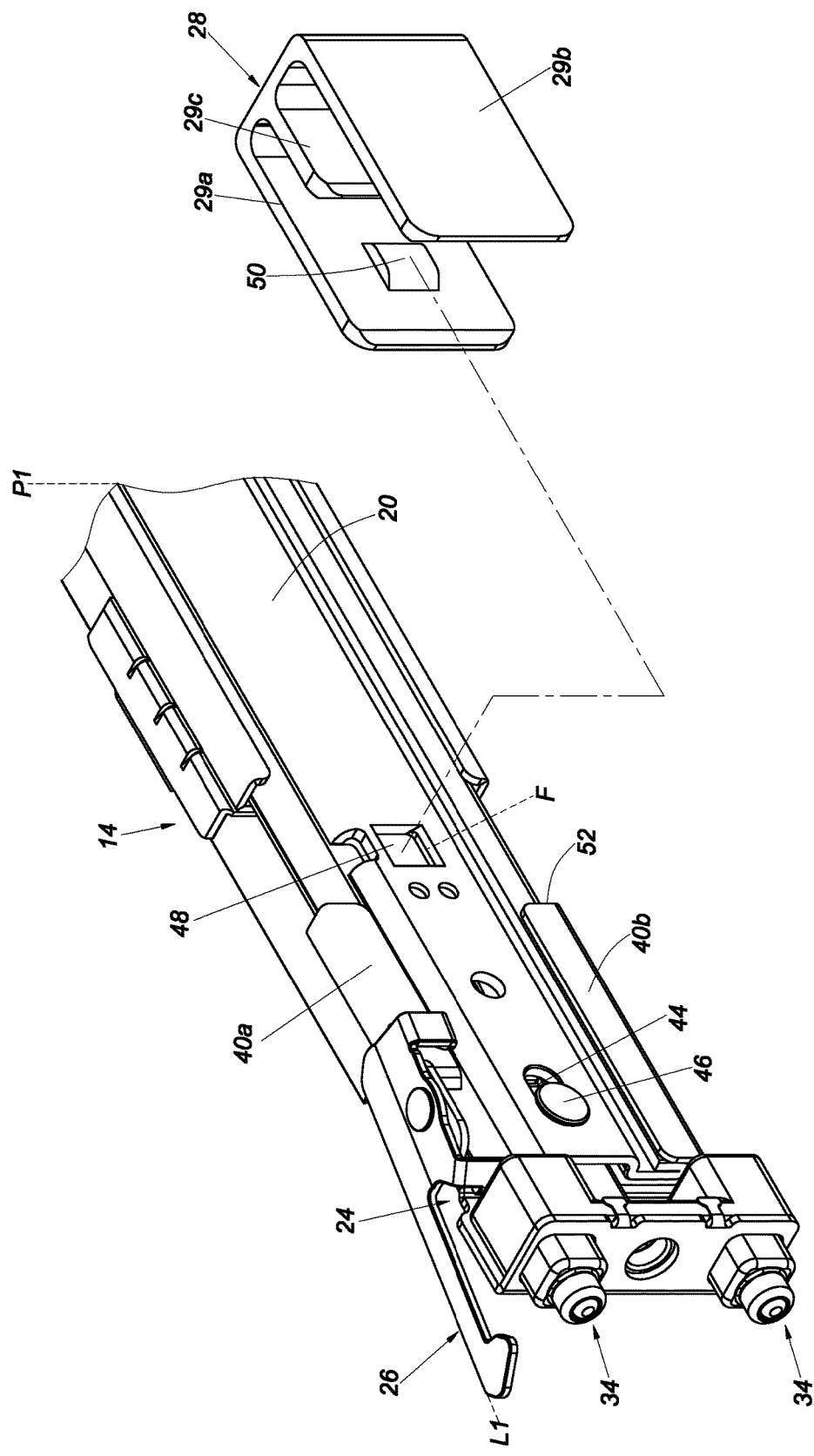
FIG. 4 shows that the fitting of the bracket device in accordance with an embodiment of the present invention is removed from a certain position.
Figure 5:
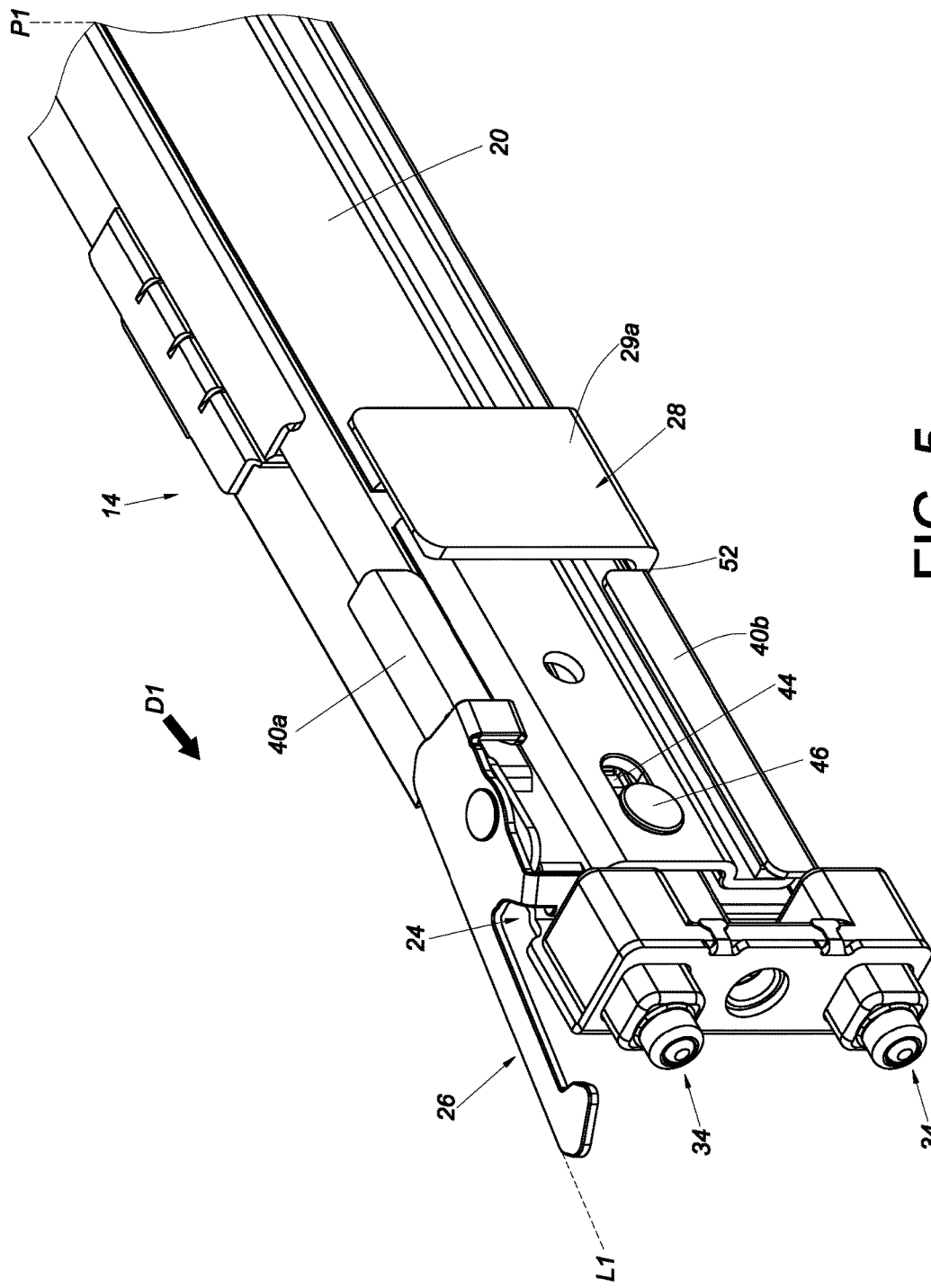
FIG. 5 shows that the fitting of the bracket device in accordance with an embodiment of the present invention is mounted at the certain position.
Figure 6:
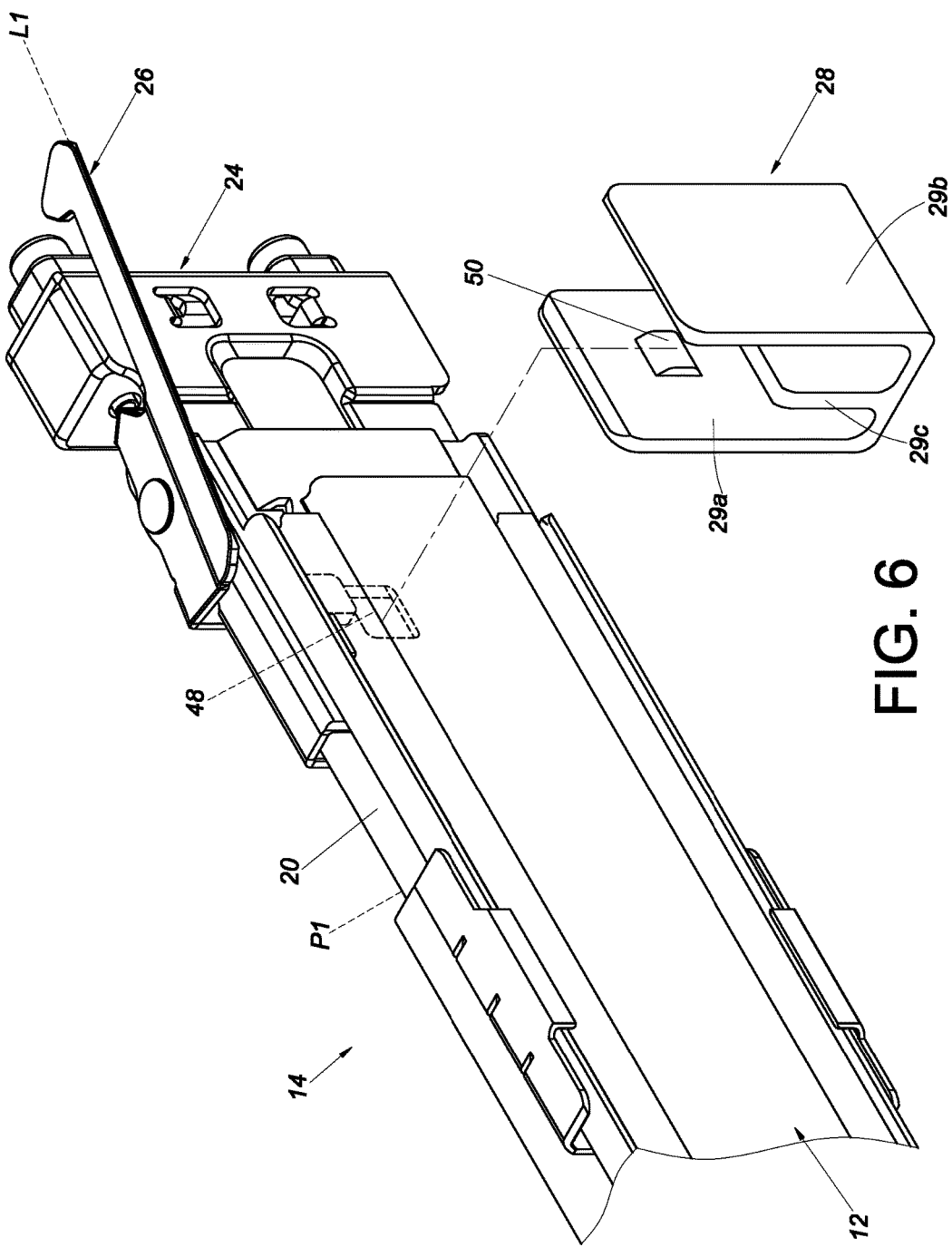
FIG. 6 shows the fitting in an embodiment of the present invention from a different viewing angle, wherein the fitting is removed from the certain position.
Figure 7:
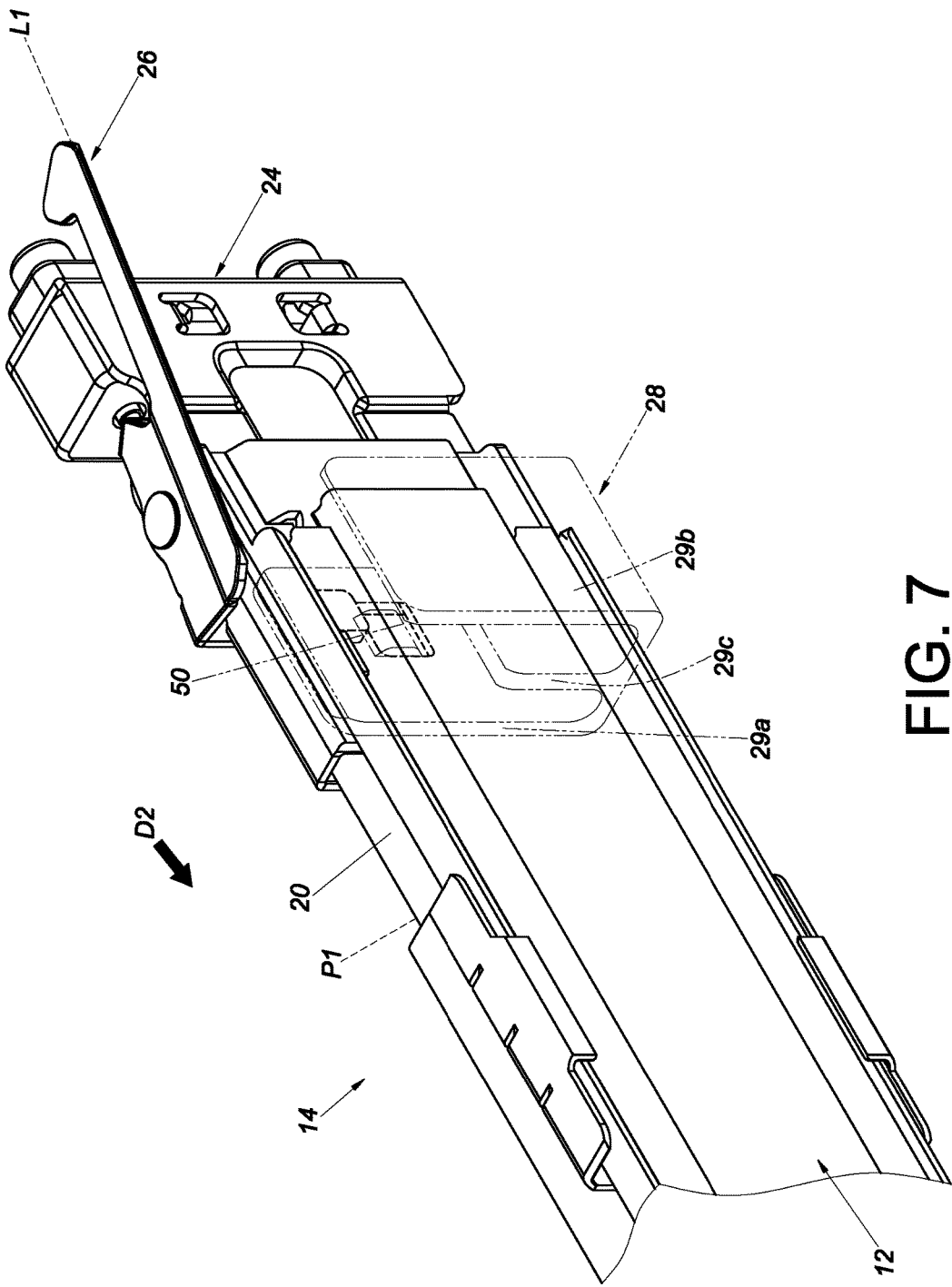
FIG. 7 shows the fitting in an embodiment of the present invention from a different viewing angle, wherein the fitting is mounted at the certain position.

Referring to FIG. 4 and FIG. 5, the fastening member 26 cannot pivot from the unlocked position L1 to the locked position L2 when the fitting 28 is at a predetermined position F on the bracket device 14. Here, by way of example, the fitting 28 is configured to be detachably mounted at the predetermined position F on the bracket device 14. The predetermined position F is defined by one of the supporting frame 20 and the bracket 24. For example, the predetermined position F is defined by the supporting frame 20. Furthermore, the supporting frame 20 includes a first mounting feature 48, and the fitting 28 includes a first portion 29a, a second portion 29b, and a middle portion 29c between the first portion 29a and the second portion 29b. A second mounting feature 50 is provided on one of the first portion 29a and the second portion 29b and in this embodiment is provided on the first portion 29a. The fitting 28 can be detachably mounted to the first mounting feature 48 through the second mounting feature 50 in order to be at the predetermined position F. The first mounting feature 48 and the second mounting feature 50 are two matching structures, such as a recess (or hole) and a protuberance (or vice versa) respectively; the present invention has no limitation in this regard.

With the fitting 28 mounted at the predetermined position F, referring to FIG. 4 to FIG. 7, the first portion 29a of the fitting 28 lies on one side of the supporting frame 20, the second portion 29b of the fitting 28 lies on one side of the slide rail mechanism 12, and the middle portion 29c of the fitting 28 is inserted between the supporting frame 20 and the slide rail mechanism 12. Moreover, with the fitting 28 mounted at the predetermined position F, a blocking feature 52 can work with the fitting 28 so that the fitting 28 is blocked by the blocking feature 52 to prevent the supporting frame 20 from being displaced in the first direction D1 with respect to the bracket 24 from the first position P1 to the second position P2. The blocking feature 52 is located at the bracket 24 for example and is implemented in this embodiment as a wall of the lower portion 40b of the bracket 24 so as to keep the supporting frame 20 from displacement with respect to the bracket 24 (e.g., displacement from the first position P1 to the second position P2), thereby preventing the fastening member 26 from pivoting from the unlocked position L1 to the locked position L2. In an alternative embodiment, the fitting 28 is coupled to the bracket 24, and the blocking feature 52 is located at the supporting frame 20.

Figure 8:
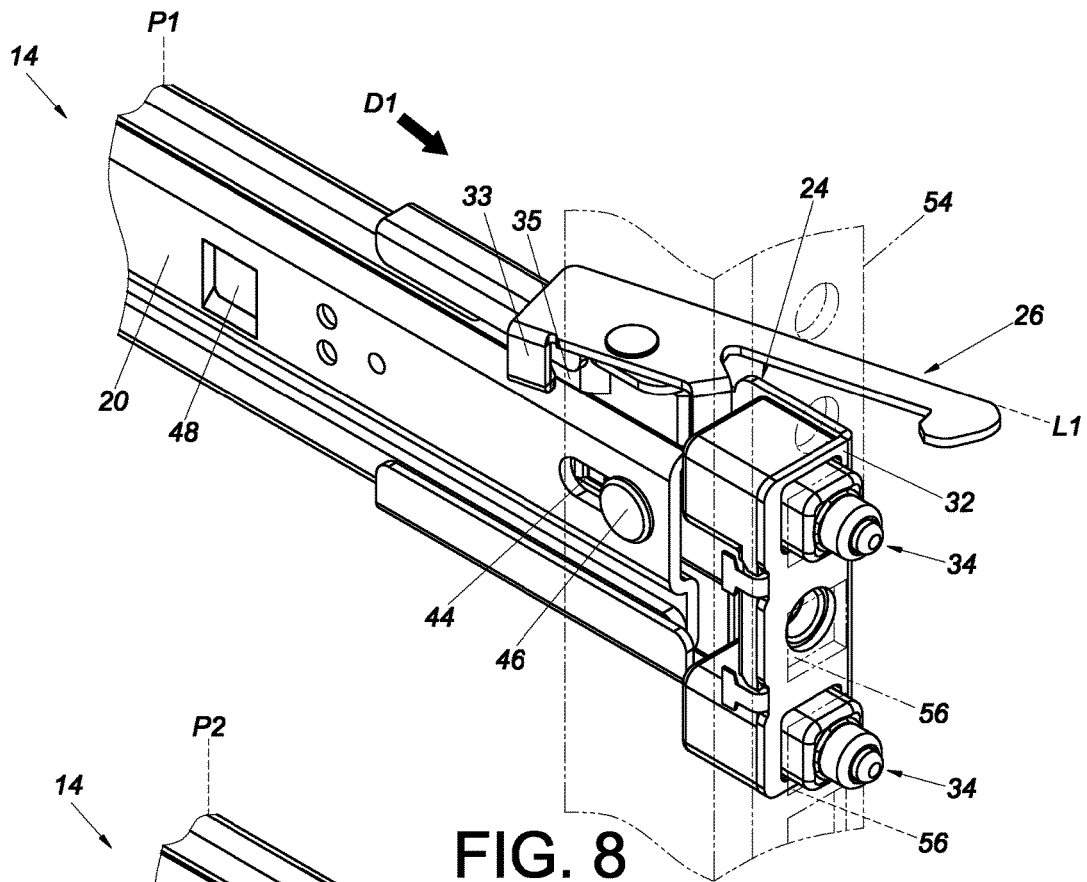
FIG. 8 shows that the bracket device in accordance with an embodiment of the present invention is applied to a post.

The bracket device 14 can be mounted to a post 54 as shown in FIG. 8, in which the fitting 28 is not at the predetermined position F on the bracket device 14 (e.g., the fitting 28 is removed from the first mounting feature 48 of the supporting frame 20). More specifically, the bracket 24 can be mounted to a hole 56 in the post 54 through the at least one mounting member 34 such that the end wall 32 of the bracket 24 is pressed against the post 54, with the supporting frame 20 at the first position P1 with respect to the bracket 24, and consequently with the second supporting portion 35 of the supporting frame 20 supporting the first supporting portion 33 of the fastening member 26 and thereby bringing the fastening member 26 to the unlocked position L1.

Figure 9:
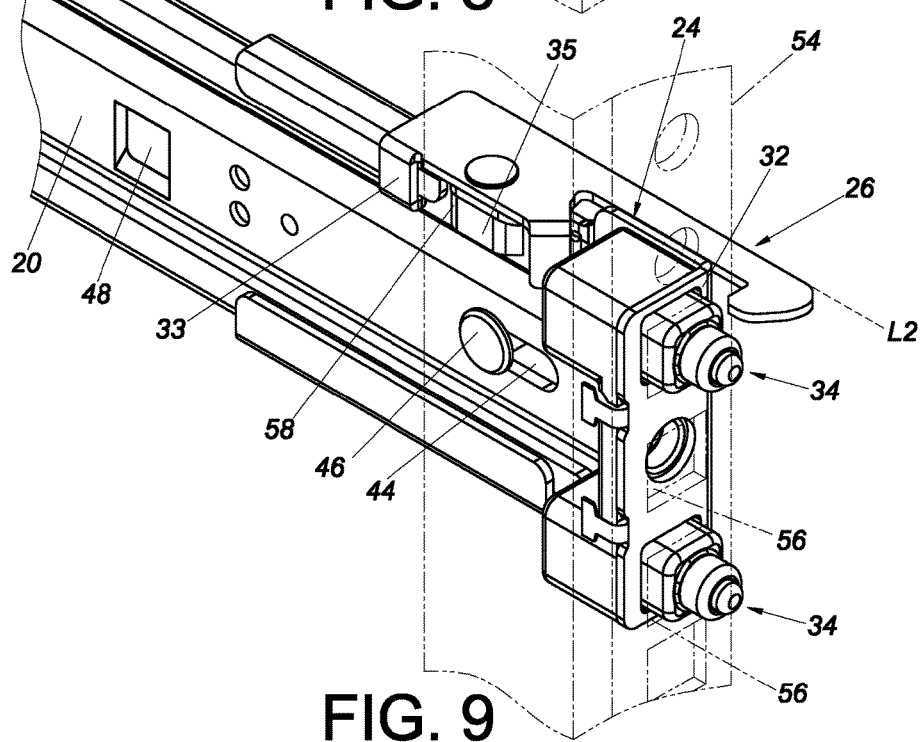
FIG. 9 shows that the bracket device in accordance with an embodiment of the present invention is mounted on the post.

As shown in FIG. 8 and FIG. 9, the fastening member 26 can be operated and thus displaced to either the unlocked position L1 or the locked position L2. For example, the supporting frame 20 can be operated and thus displaced in the first direction D1 with respect to the bracket 24 from the first position P1 toward the post 54 until the second position P2 is reached. During this process, the supporting frame 20 displaces the fastening member 26 from the unlocked position L1 to the locked position L2, and the fastening member 26 in the locked position L2 is locked to the post 54 and thereby fastens the bracket 24 to the post 54. For example, in the course in which the supporting frame 20 is displaced in the first direction D1, the supporting frame 20 drives the fastening member 26 through contact between the second supporting portion 35 and the first supporting portion 33.

Preferably, one of the first supporting portion 33 and the second supporting portion 35 has a guiding section 58, which may be an inclined or curved surface. Here, the guiding section 58 is provided on the second supporting portion 35 by way of example. In the course in which the supporting frame 20 is operated and thus displaced with respect to the bracket 24 in a second direction D2 (which is the opposite direction of the first direction D1) from the second position P2 to the first position P1, the guiding section 58 is in contact with the first supporting portion 33 and drives the fastening member 26 from the locked position L2 back to the unlocked position L1.

As shown in FIG. 10, FIG. 11, FIG. 12, and FIG. 13, the coupling assembly 10 is adapted to be mounted to a rack that includes the post 54 and another post 60. More specifically, the bracket 24 of the bracket device 14 can be mounted to the hole 56 in the post 54 through the at least one mounting member 34, and the supporting frame 20 can be operated and thus displaced in the first direction D1 with respect to the bracket 24 from the first position P1 to the second position P2 and, during the same process, displace the fastening member 26 from the unlocked position L1 to the locked position L2 through contact between the second supporting portion 35 and the first supporting portion 33 so as to fasten the bracket 24 to the post 54. The bracket device 16, on the other hand, can be displaced in the second direction D2 in order to be mounted to a hole 64 in the post 60 through at least one mounting member 62. The mounting process of the bracket device 16 should be readily understandable by a person of ordinary skill in the art and therefore will not be dealt with in more detail.

Figure 14:
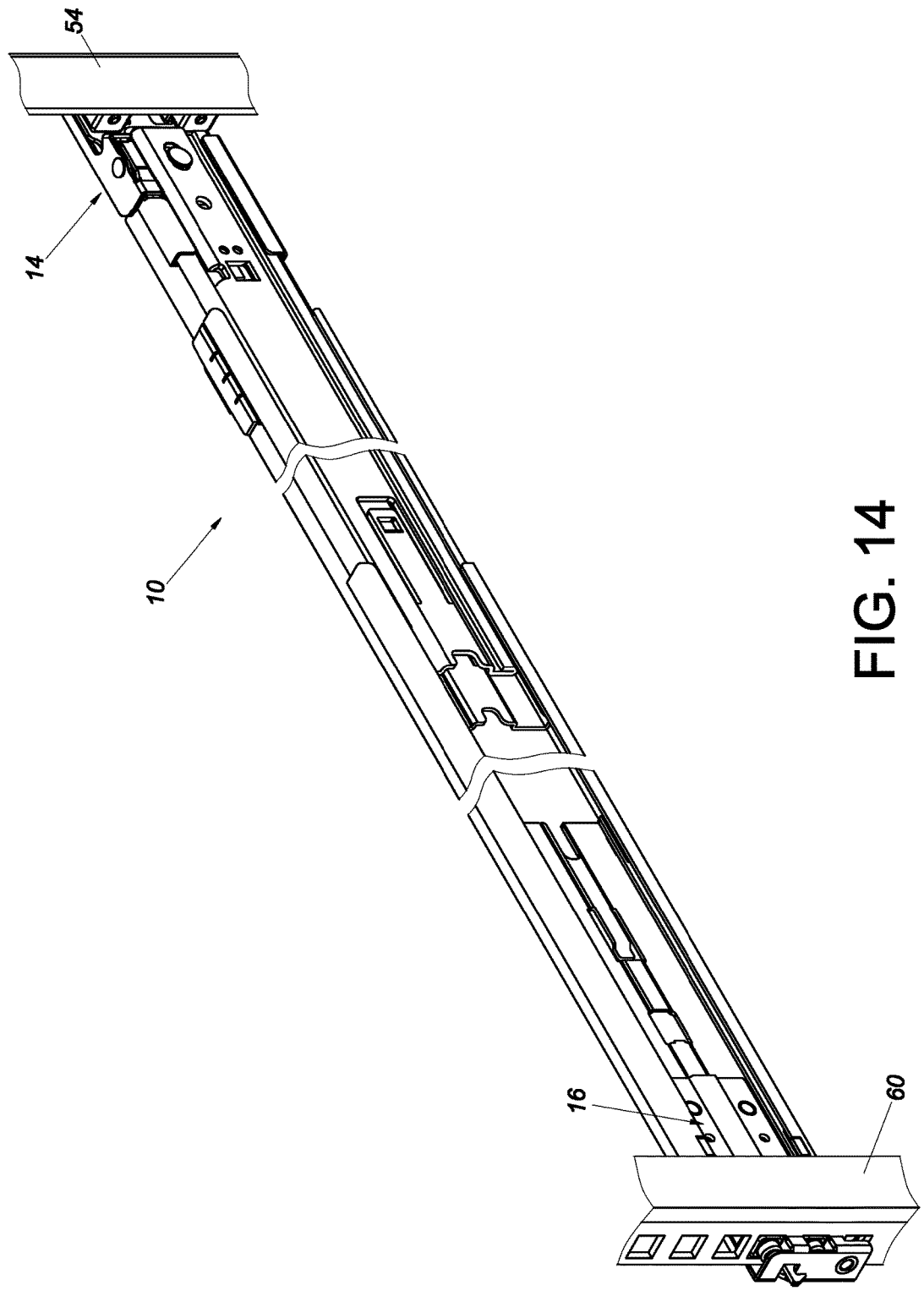
FIG. 14 is a perspective view showing that the coupling assembly in accordance with an embodiment of the present invention is mounted on a rack.

As shown in FIG. 14, the coupling assembly 10 can be mounted to the posts 54 and 60 via the bracket devices 14 and 16 respectively.

According to the above, the bracket devices used in the coupling assemblies in the foregoing embodiments preferably have the following features:
1. When the fitting 28 is at a predetermined position, the fastening member 26 is kept from leaving a particular position (e.g., the unlocked position L1).
2. When the fitting 28 is not at the predetermined position, a single operator can mount/dismount the coupling assembly 10 to/from the two posts 54 and 60 of the rack while standing in front of the rack, and the mounting/dismounting process can be carried out rapidly without difficulty.

While the present invention has been disclosed by way of the preferred embodiments described above, it should be understood that those embodiments are not intended to be restrictive of the scope of the invention. The scope of patent protection sought by the applicant is defined by the appended claims.

What is claimed is:

1. A bracket device adapted to be mounted to a post, the bracket device comprising:
   a bracket provided with a mounting member in order to be mounted to the post;
   a fastening member displaceable to either an unlocked position or a locked position by operation; and
   a fitting;
   wherein when the fitting is at a predetermined position, the fastening member is prevented from being displaced from the unlocked position to the locked position; and
   wherein when the fitting is not at the predetermined position, the fastening member is allowed to be displaced from the unlocked position to the locked position and thereby fasten the bracket to the post.

2. The bracket device of claim 1, further comprising a supporting frame displaceable with respect to the bracket, wherein when the fitting is not at the predetermined position, the supporting frame is allowed to be displaced with respect to the bracket from a first position to a second position, thereby displacing the fastening member from the unlocked position to the locked position.

3. The bracket device of claim 2, wherein one of the bracket and the supporting frame includes a guiding feature to facilitate displacement of the supporting frame with respect to the bracket.

4. The bracket device of claim 2, wherein the fastening member is movably mounted on the bracket and includes a first supporting portion; the supporting frame includes a second supporting portion; when the supporting frame is at the first position, the second supporting portion of the supporting frame supports the first supporting portion of the fastening member such that the fastening member is at the unlocked position; and when the supporting frame is at the second position, the second supporting portion of the supporting frame does not support the first supporting portion of the fastening member such that the fastening member is no longer at the unlocked position.

5. The bracket device of claim 2, wherein the predetermined position is defined by one of the supporting frame and the bracket; the bracket device includes a blocking feature on the other one of the supporting frame and the bracket; and when the fitting is at the predetermined position, the blocking feature and the fitting work together to prevent the supporting frame from being displaced with respect to the bracket from the first position to the second position.

6. A bracket device, comprising:
   a bracket;
   a fastening member movably mounted on the bracket and including a first supporting portion;
   a supporting frame including a second supporting portion, wherein once the supporting frame is operated and thereby displaced with respect to the bracket to a first position, the second supporting portion of the supporting frame supports the first supporting portion of the fastening member such that the fastening member is in a particular position; and once the supporting frame is operated and thereby displaced with respect to the bracket to a second position, the second supporting portion of the supporting frame does not support the first supporting portion of the fastening member such that the fastening member is no longer in the particular position; and
   a fitting;
   wherein when the fitting is at a predetermined position on the supporting frame, the supporting frame is prevented from being displaced with respect to the bracket from the first position to the second position; and
   wherein when the fitting is not at the predetermined position, the supporting frame is allowed to be displaced with respect to the bracket from the first position to the second position.

7. The bracket device of claim 6, wherein one of the bracket and the supporting frame includes a guiding feature to facilitate displacement of the supporting frame with respect to the bracket.

8. The bracket device of claim 6, further comprising a blocking feature on the bracket, wherein when the fitting is at the predetermined position on the supporting frame, the blocking feature and the fitting work together to prevent the supporting frame from being displaced with respect to the bracket from the first position to the second position.

9. A coupling assembly adapted to be mounted to a post, the coupling assembly comprising:
   a slide rail mechanism; and
   a bracket device coupled to the slide rail mechanism, wherein the bracket device includes:
      a bracket provided with a mounting member in order to be mounted to the post;
      a fastening member displaceable to either an unlocked position or a locked position by operation; and
      a fitting;
      wherein when the fitting is at a predetermined position, the fastening member is prevented from being displaced from the unlocked position to the locked position; and
      wherein when the fitting is not at the predetermined position, the fastening member is allowed to be displaced from the unlocked position to the locked position and thereby fasten the bracket to the post.

10. The coupling assembly of claim 9, wherein the bracket device includes a supporting frame displaceable with respect to the bracket, and when the fitting is not at the predetermined position, the supporting frame is allowed to be displaced with respect to the bracket from a first position to a second position, thereby displacing the fastening member from the unlocked position to the locked position.

11. The coupling assembly of claim 10, wherein one of the bracket and the supporting frame includes a guiding feature to facilitate displacement of the supporting frame with respect to the bracket.

12. The coupling assembly of claim 10, wherein the fastening member is movably mounted on the bracket and includes a first supporting portion; the supporting frame includes a second supporting portion; when the supporting frame is at the first position, the second supporting portion of the supporting frame supports the first supporting portion of the fastening member such that the fastening member is at the unlocked position; and when the supporting frame is at the second position, the second supporting portion of the supporting frame does not support the first supporting portion of the fastening member such that the fastening member is no longer at the unlocked position.

13. The coupling assembly of claim 10, wherein the predetermined position is defined by one of the supporting frame and the bracket; the bracket device includes a blocking feature on the other one of the supporting frame and the bracket; and when the fitting is at the predetermined position, the blocking feature and the fitting work together to prevent the supporting frame from being displaced with respect to the bracket from the first position to the second position.

* * * * *